(12) United States Patent
Cho et al.

(10) Patent No.: US 7,887,887 B2
(45) Date of Patent: Feb. 15, 2011

(54) LIQUID CRYSTAL POLYESTER RESIN COMPOSITION AND PRINTED CIRCUIT BOARD USING THE SAME

(75) Inventors: Chung-Kun Cho, Suwon-si (KR); Myung-Sup Jung, Seongnam-si (KR); Yoo-Seung Yang, Daejeon (KR); Mahn-Jong Kim, Daejeon (KR); Tae-Jun Ok, Daejeon (KR)

(73) Assignees: Samsung Electronics Co., Ltd. (KR); Samsung Electro-Mechanics Co., Ltd. (KR); Samsung Fine Chemicals Co., Ltd. (KR)

( * ) Notice: Subject to any disclaimer, the term of this patent is extended or adjusted under 35 U.S.C. 154(b) by 338 days.

(21) Appl. No.: 12/123,748

(22) Filed: May 20, 2008

(65) Prior Publication Data

US 2009/0111949 A1 Apr. 30, 2009

(30) Foreign Application Priority Data

Oct. 25, 2007 (KR) .................. 10-2007-0107693

(51) Int. Cl.
*B05D 1/02* (2006.01)
*B05D 1/18* (2006.01)
*B32B 15/00* (2006.01)
*C08L 67/00* (2006.01)

(52) U.S. Cl. ................. 427/420; 427/421.1; 427/427.4; 427/427.6; 427/428.1; 427/430.1; 428/411.1; 428/458; 428/474.4; 428/480; 524/210; 524/233; 524/538; 525/420; 525/437

(58) Field of Classification Search ................. 524/210, 524/233, 538; 428/474.4, 480, 411.1, 458; 427/420, 421.1, 427.4, 427.6, 428.1, 430.1; 525/420, 437

See application file for complete search history.

(56) References Cited

U.S. PATENT DOCUMENTS

2005/0209429 A1* 9/2005 Dingemans et al. ........... 528/59
2009/0137724 A1* 5/2009 Taguchi et al. .............. 524/539

* cited by examiner

*Primary Examiner*—Ana L Woodward
(74) *Attorney, Agent, or Firm*—Cantor Colburn LLP

(57) ABSTRACT

Disclosed herein is a liquid crystal polyester resin composition and a printed circuit board using the composition. The composition comprises a liquid crystal polyester, a polybenzimidazole and an aprotic solvent. The composition exhibits good thermal stability and has a low dielectric constant. The composition can be advantageously used as a material for printed circuit boards (PCBS) used in semiconductor packages, mobile devices and LCD devices.

13 Claims, 2 Drawing Sheets

LIQUID CRYSTAL POLYESTER RESIN COMPOSITION AND PRINTED CIRCUIT BOARD USING THE SAME

This application claims priority under U.S.C. §119 to Korean Patent Application No. 10-2007-107693, filed on Oct. 25, 2007, in the Korean Intellectual Property Office (KIPO), the entire contents of which are hereby incorporated by reference.

BACKGROUND

1. Field of Invention

This disclosure relates to a liquid crystal polyester resin composition and a printed circuit board that uses the composition. This disclosure also relates to a liquid crystal polyester resin composition with improved thermal stability which comprises a liquid crystal polyester, a polybenzimidazole and an aprotic solvent, and a printed circuit board that uses the composition.

2. Description of the Related Art

Recent advances in information and communication technologies have rapidly transformed our society into a high-tech communication and information society. The trend toward miniaturization and high performance of electronic devices (e.g., mobile phones and personal computers) has led to high-density integration of printed circuit boards as essential elements of electronic devices. Such high-density integration is achieved through layering of printed circuit boards, the reduction in the thickness of printed circuit boards, the reduction in the diameter and interval of through-holes, and so on. Under these circumstances, there is a need for substrate materials that exhibit improved performance characteristics.

The use of high operating frequencies for rapid processing of data in electronic digital devices (e.g., computers) involves the problems of transmission loss and signal delay. For example, FR-4 copper clad laminate, which is presently the most widely used type of copper clad laminate, suffers from problems of increased transmission loss and signal delay because of its relatively high permittivity (ca. 3.5-5.5). A signal delay in a printed circuit board increases linearly with the square root of the relative permittivity of an insulating material that is disposed around the lines. Thus, a low-permittivity material having a low dielectric loss is needed to produce a substrate where a high transmission rate is required. There is also a need for a substrate material that is thermally stable enough to withstand heat generated from the resistance of conductors.

SUMMARY

Exemplary embodiments disclose a liquid crystal polyester resin composition with low dielectric properties and improved thermal stability.

Specifically, the composition of exemplary embodiments comprises a liquid crystal polyester, a polybenzimidazole and an aprotic solvent.

The liquid crystal polyester may be a polyamide ester. Specifically, the liquid crystal polyester may contain at least one structural unit selected from the group consisting of the following structural units 1:

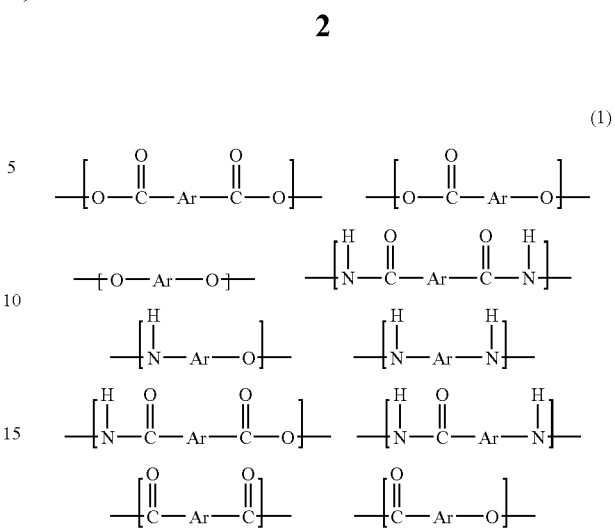

(1)

wherein each Ar is selected from the group consisting of the following groups 2:

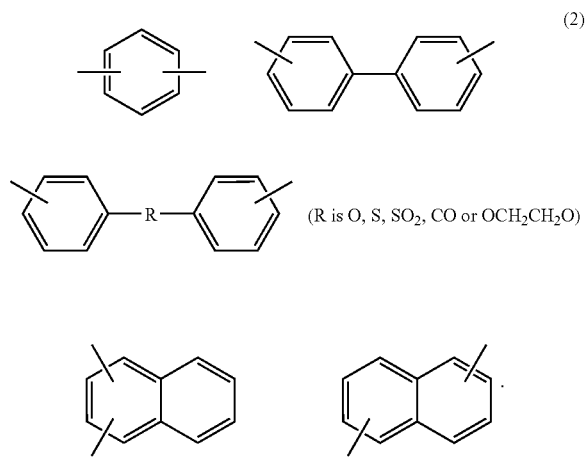

(2)

(R is O, S, $SO_2$, CO or $OCH_2CH_2O$)

The polybenzimidazole may be selected from the group consisting of, but not necessarily limited to, poly-2,2'-(m-phenylene)-5,5'-dibenzimidazole, poly-2,2'-(diphenylene-2",2'")-5,5'-dibenzimidazole, poly-2,2'-(diphenylene-4",4'")-5,5'-dibenzimidazole, poly-2,2'-(1",1",3"-trimethylindanylene)-3",5'"-p-phenylene-5',5'-dibenzimidazole, 2,2'-(m-phenylene)-5,5'-dibenzimidazole/2,2'-(1",1",3"-trimethylindanylene)-3",5'"-p-phenylene-5,5'-dibenzimidazole copolymer, 2,2'-(m-phenylene)-5,5'-dibenzimidazole/2,2'-(diphenylene-2",2'")-5,5'-dibenzimidazole copolymer, poly-2,2'-(furylene-2",5")-5,5'-dibenzimidazole, poly-2,2'-(naphthalene-1",6")-5,5'-dibenzimidazole, poly-2,2'-(naphthalene-2",6")-5,5'-dibenzimidazole, poly-2,2'-amylene-5,5'-dibenzimidazole, poly-2,2'-octamethylene-5,5'-dibenzimidazole, poly-2,2'-cyclohexenyl-5,5'-dibenzimidazole, poly-2,2'-(m-phenylene)-5,5'-di(benzimidazole)ether, poly-2,2'-(m-phenylene)-5,5'-di(benzimidazole)sulfide, poly-2,2'-(m-phenylene)-5,5'-di(benzimidazole)sulfone, poly-2,2'-(m-phenylene)-5,5'-di(benzimidazole)methane, poly-2,2'-(m-phenylene)-5,5'-di(benzimidazole)propane-2,2 and poly-ethylene-1,2,2,2"-(m-phenylene)-5,5'-di(benzimidazole)ethylene-1,2.

A preferred polybenzimidazole is represented by Formula 3:

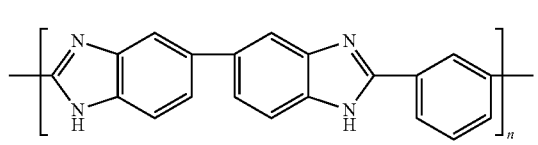

(3)

wherein n is from about 16 to about 1,600.

The polybenzimidazole may have a number average molecular weight ranging from about 5,000 to about 500,000 grams per mole.

The composition may comprise about 0.1 to about 300 parts by weight of the liquid crystal polyester, about 0.01 to about 30 parts by weight of the polybenzimidazole and about 100 parts by weight of the aprotic solvent.

Exemplary embodiments also provide a printed circuit board that is produced using the composition to achieve low dielectric properties and improved thermal stability.

The substrate in the exemplary embodiments may be a printed board, a copper foil, a copper clad laminate or a prepreg. Specifically, the substrate may be a copper clad laminate (CCL) or a flexible CCL.

BRIEF DESCRIPTION OF THE DRAWINGS

Example embodiments will be more clearly understood from the following detailed description taken in conjunction with the accompanying drawings.

FIG. 1 is a plan view photograph of a prepreg produced in Example 6;

FIG. 2 is a plan view photograph of a prepreg produced in Comparative Example 2; and FIG. 3 shows differential scanning calorimeter (DSC) thermograms of films produced in Examples 7 and 8 and Comparative Examples 3.

Figure 1:
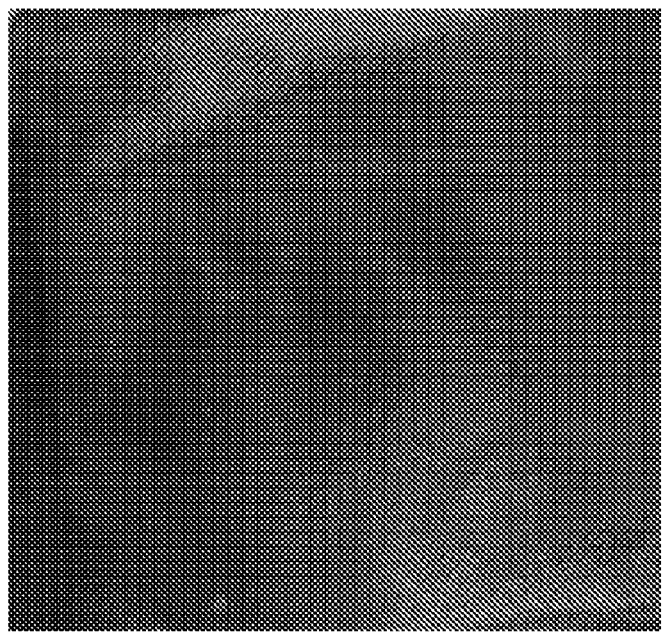
FIGS. 1 to 3 represent non-limiting, example embodiments as described herein.

It should be noted that these Figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by the exemplary embodiments. For example, the relative thicknesses and positioning of the molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXEMPLARY EMBODIMENTS

Hereinafter, exemplary embodiments will be described in detail with reference to the attached drawings. Reference now should be made to the drawings, in which the same reference numerals are used throughout the different drawings to designate the same or similar components. In the drawings, the thicknesses and widths of layers are exaggerated for clarity. Exemplary embodiments may, however, be embodied in many different forms and should not be construed as limited to the exemplary embodiments set forth herein. Rather, these exemplary embodiments are provided so that this disclosure will be thorough and complete, and will fully convey the scope of the exemplary embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, or the like, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of the exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments provide a liquid crystal polyester resin composition comprising a liquid crystal polyester, a polybenzimidazole and an aprotic solvent.

The liquid crystal polyester resin has a dielectric constant as low as about 3.0, improved heat resistance and a low moisture absorption. Based on these advantages, the liquid crystal polyester resin is suitable as a substrate material. The polybenzimidazole exhibits excellent mechanical properties and serves to maintain chemical and thermal stability of the composition. The composition, which comprises a liquid crystal polyester and a polybenzimidazole, is used to produce a printed circuit board with a low coefficient of thermal expansion when compared to a conventional printed circuit board produced using a liquid crystal polyester only. In addition, no glass transition temperature is observed in a printed circuit board produced using the composition, indicating a markedly improved thermal stability for the printed circuit board.

Although the mechanism of the action of the polybenzimidazole is not clearly established, it is assumed that the thermal stability of the composition is improved because the movement of the chains of the polyester is limited due to the formation of physical bonds by hydrogen-bonding interactions between the polybenzimidazole and the polyester, as depicted below.

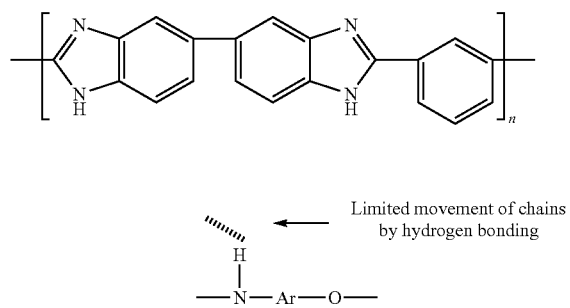

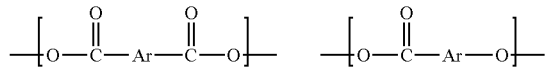

The liquid crystal polyester is preferably a polyamide ester. The liquid crystal polyester may contain at least one structural unit selected from the group consisting of the following structural units 1:

(1)

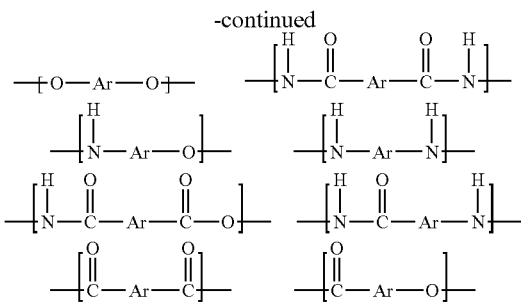

-continued wherein each Ar is selected from the group consisting of the following groups 2:

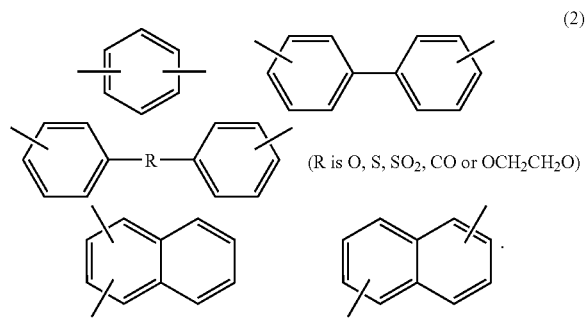

(2)

(R is O, S, SO$_2$, CO or OCH$_2$CH$_2$O)

Ar may be substituted with an alkyl group, an alkoxy group, an aryl group or a halogen atom.

Specifically, the liquid crystal polyester may contain a structural unit derived from an aromatic hydroxycarboxylic acid, an aromatic dicarboxylic acid, a dioxy structural unit, or an aromatic amine or hydroxylamine.

Suitable structural units derived from aromatic hydroxycarboxylic acids include those derived from p-hydroxybenzoic acid, 4-hydroxy-4'-biphenylcarboxylic acid, 2-hydroxy-6-naphthalenecarboxylic acid, 2-hydroxy-5-naphthalenecarboxylic acid, 3-hydroxy-2-naphthalenecarboxylic acid, 2-hydroxy-3-naphthalenecarboxylic acid, 4'-hydroxyphenyl-4-benzoic acid, 3'-hydroxyphenyl-4-benzoic acid, 4'-hydroxyphenyl-3-benzoic acid, and alkyl, alkoxy, aryl and halogen substituents thereof. One or more of these structural units may be included in the liquid crystal polyester.

Suitable structural units derived from aromatic dicarboxylic acids include those derived from terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl)ether, bis(4-carboxyphenyl)butane, bis(4-carboxyphenyl)ethane, bis(3-carboxyphenyl)ether and bis(3-carboxyphenyl)ethane, and alkyl, alkoxy, aryl and halogen substituents thereof. One or more of these structural units may be included in the liquid crystal polyester. A structural unit derived from isophthalic acid or diphenyl ether-4,4'-dicarboxylic acid is preferred because of the solubility of a solution of the liquid crystal polyester.

Suitable aromatic dioxy structural units include aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl, 3,3'-dihydroxybiphenyl, 3,4'-dihydroxybiphenyl, 4,4'-dihydroxybiphenyl ether and bis(4- hydroxyphenyl)ethane, and alkyl, alkoxy, aryl and halogen substituents thereof. Of these, hydroquinone, 4,4'-dihydroxybiphenyl and 2,6-dihydroxynaphthalene are preferred.

Suitable structural units derived from aromatic diamines or hydroxylamines include those derived from 3-aminophenol, 4-aminophenol, 1,4-phenylenediamine and 1,3-phenylenediamine. One or more kinds of these structural units may be included in the liquid crystal polyester. A structural unit derived from 4-aminophenol is preferred in view of reactivity.

Any method known in the art may be employed to prepare the liquid crystal polyester. For example, the liquid crystal polyester is prepared by activating a carboxylic acid unit with an acid chloride, a sulfonic anhydride, or the like, and reacting the activated carboxylic acid unit with a phenolic unit in the presence of a base (using the 'acid chloride method'). Further, the liquid crystal polyester is prepared by direct condensation of a carboxylic acid unit with a phenolic unit using a condensing agent, such as dicyclohexylcarbodiimide. Further, the liquid crystal polyester is prepared by acetylation of a phenolic unit and melt-acidolysis polymerization of the acetylated phenolic unit with a carboxylic acid unit. Further, a crude liquid crystal polyester obtained by polymerization is purified by recrystallization, reprecipitation, or the like, to prepare the liquid crystal polyester.

Any suitable analytical technique, such as nuclear magnetic resonance (NMR) spectroscopy, may be adopted to identify the contents of the respective structural units in the liquid crystal polyester.

Polybenzimidazoles suitable for use in the exemplary embodiments are not particularly limited, and examples thereof include poly-2,2'-(m-phenylene)-5,5'-dibenzimidazole, poly-2,2'-(diphenylene-2'',2''')-5,5'-dibenzimidazole, poly-2,2'-(diphenylene-4'',4''')-5,5'-dibenzimidazole, poly-2,2'-(1'',1'',3''-trimethylindanylene)-3'',5''-p-phenylene-5',5'-dibenzimidazole, 2,2'-(m-phenylene)-5,5'-dibenzimidazole/2,2'-(1'',1'',3''-trimethylindanylene)-3'',5''-p-phenylene-5,5'-dibenzimidazole copolymer, 2,2'-(m-phenylene)-5,5'-dibenzimidazole/2,2'-diphenylene-2'',2''')-5,5'-dibenzimidazole copolymer, poly-2,2'-(furylene-2'',5'')-5,5'-dibenzimidazole, poly-2,2'-(naphthalene-1'',6'')-5,5'-dibenzimidazole, poly-2,2'-(naphthalene-2'',6'')-5,5'-dibenzimidazole, poly-2,2'-amylene-5,5'-dibenzimidazole, poly-2,2'-octamethylene-5,5'-dibenzimidazole, poly-2,2'-cyclohexenyl-5,5'-dibenzimidazole, poly-2,2'-(m-phenylene)-5,5'-di(benzimidazole)ether, poly-2,2'-(m-phenylene)-5,5'-di(benzimidazole)sulfide, poly-2,2'-(m-phenylene)-5,5'-di(benzimidazole)sulfone, poly-2,2'-(m-phenylene)-5,5'-di(benzimidazole)methane, poly-2,2'-(m-phenylene)-5,5'-di(benzimidazole)propane-2,2, and poly-ethylene-1,2,2,2''-(m-phenylene)-5,5'-di(benzimidazole)ethylene-1,2.

A preferred polybenzimidazole may be represented by Formula 3:

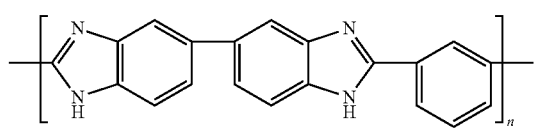

(3)

wherein n is from about 16 to about 1,600.

The number average molecular weight of the polybenzimidazole is preferably in the range of about 5,000 to about 500,000 grams per mole, but is not especially limited to this range.

The composition comprises an aprotic solvent suitable for solvent casting. The aprotic solvent serves to prevent deterioration in the mechanical properties of the composition due to the anisotropic liquid crystal polymer.

There is no particular limitation to the kind of aprotic solvents that can be used the composition. The aprotic solvent can be selected from N,N-dimethylacetamide, N-methylpyrrolidone, N-methylcaprolactam, N,N-dimethylformamide, N,N-diethylformamide, N,N-diethylacetamide, N-methylpropionamide, dimethylsulfoxide, γ-butyrolactone, dimethylimidazolidinone, tetramethylphosphoramide, ethyl cellosolve acetate, and a combination comprising at least one of the foregoing aprotic solvents.

The composition may comprise 0.1 to 300 parts by weight of the liquid crystal polyester, 0.01 to 30 parts by weight of the polybenzimidazole and 100 parts by weight of the aprotic solvent. The use of the polybenzimidazole in an amount of less than 0.01 parts by weight does not contribute to the improvement of thermal characteristics. Meanwhile, the use of the polybenzimidazole in an amount greater than 30 parts by weight makes the composition more hygroscopic, resulting in an increase in dielectric constant, and may cause excessive signal loss and delay.

In addition to the liquid crystal polyester, the polybenzimidazole and the aprotic solvent, the composition may further comprise one or more additives selected from solvents, fillers, softeners, plasticizers, lubricants, antistatic agents, colorants, antioxidants, heat stabilizers, light stabilizers and UV absorbers, so long as the objects of exemplary embodiments are accomplished.

Examples of the fillers include organic fillers, such as epoxy, melamine, urea, benzoguanamine and styrene resin powders, and inorganic fillers, such as silica, alumina, titanium oxide, zirconia, kaolin, calcium carbonate and calcium phosphate.

There is no particular limitation to the preparation method of the composition according to example embodiments. For example, the composition of example embodiments is prepared by directly compounding or mixing predetermined amounts of the liquid crystal polyester and the polybenzimidazole with the aprotic solvent and optionally one or more additives, and kneading the mixture at room temperature or under heating (direct mixing) or mixing the mixture in a solvent followed by removal of the solvent.

The composition of example embodiments can be used as a next-generation packaging material requiring high heat resistance and a low coefficient of thermal expansion. The composition can be molded into a substrate or dissolved in a suitable solvent to prepare a varnish for impregnation or coating applications. The applications of the composition include laminates, printed boards, layers of multilayer substrates, resin-coated copper foils, copper clad laminates, TAB films and prepregs, but are not limited thereto.

The composition of example embodiments is cast on a substrate to form a thin film.

A prepreg can be produced by impregnating a glass fiber with the composition and removing the aprotic solvent. The impregnation can be performed by any technique known in the art, such as dip coating or roll coating.

A copper clad laminate can be produced by applying the composition in the form of a solution to a copper foil or casting the composition on a copper foil, removing the solvent, followed by thermal treatment. The solvent is preferably removed by evaporation. The evaporation is performed under reduced pressure or by ventilation.

The solution can be applied by various techniques, including roll coating, dip coating, spray coating, spin coating, curtain coating, slot coating, electrostatic painting and screen printing. It is preferred to remove fine impurities contained in the solution by filtration before application to or prior to casting on a copper foil.

Hereinafter, the exemplary embodiments will be described in detail with reference to Examples. These Examples are set forth to illustrate the exemplary embodiments, but should not be construed as the limit of the exemplary embodiments.

EXAMPLES

Synthesis Example 1

8.3 g (0.05 mol) of isophthalic acid, 18.8 g (0.1 mol) of 6-hydroxy-2-naphthoic acid, 5.5 g (0.05 mol) of 4-aminophenol and 32.7 g (0.32 mol) of acetic anhydride were introduced into a 500 ml flask equipped with a condenser and a mechanical stirrer. The mixture was slowly heated to 150° C. under a nitrogen atmosphere and allowed to react (acetylation) for 4 hours while maintaining the reaction temperature constant. After completion of the reaction, the reaction mixture was heated to 300° C. while removing acetic acid as a by-product of the reaction and unreacted acetic anhydride. The reaction was continued for one hour, yielding a liquid crystal polyester.

Example 1

9.8 g of the polyester prepared in Synthesis Example 1 and 0.2 g of the polybenzimidazole of Formula 3 were added to 40 g of NMP. The mixed solution was impregnated into a glass fiber having a size of 40×40×0.05 (mm). The resulting glass fiber was placed on an electrodeposited copper foil and dried in a furnace for 2 hours while raising the temperature of the furnace from room temperature to 300° C. The specimen was treated with 50 parts by weight of a nitric acid solution to completely remove the copper foil, leaving a prepreg only. At this time, 0.55 parts by weight of the polymers were impregnated into one part by weight of the glass fiber.

The glass transition temperature and the coefficient of thermal expansion (CTE) of the prepreg were measured using a thermomechanical analyzer (TMA) (TMA 2940, TA Instruments). The results are shown in Table 1. The CTE of the prepreg was measured at elevated temperature (5° C./min.) under a nitrogen atmosphere.

Example 2

A prepreg was produced in the same manner as in Example 1 except that 9.6 g of the liquid crystal polyester prepared in Synthesis Example 1 and 0.4 g of the polybenzimidazole of Formula 3 were added and mixed.

Example 3

A prepreg was produced in the same manner as in Example 1 except that 9.4 g of the liquid crystal polyester prepared in Synthesis Example 1 and 0.6 g of the polybenzimidazole of Formula 3 were added and mixed.

Example 4

A prepreg was produced in the same manner as in Example 1 except that 9.2 g of the liquid crystal polyester prepared in Synthesis Example 1 and 0.8 g of the polybenzimidazole of Formula 3 were added and mixed.

Example 5

A prepreg was produced in the same manner as in Example 1 except that 9.0 g of the liquid crystal polyester prepared in Synthesis Example 1 and 1.0 g of the polybenzimidazole of Formula 3 were added and mixed.

Comparative Example 1

A prepreg was produced in the same manner as in Example 1 except that 10 g of the liquid crystal polyester prepared in Synthesis Example 1 only was added to 40 g of NMP.

TABLE 1

|  | $T_g$ (° C.) | CTE (ppm) |
|---|---|---|
| Example 1 | — | 4.7 |
| Example 2 | — | 11.2 |
| Example 3 | — | 5.0 |
| Example 4 | — | 1.7 |
| Example 5 | — | 3.3 |
| Comparative Example 1 | 140 | 16 |

The results of Table 1 show that the prepregs produced using the compositions comprising the polybenzimidazole had no glass transition temperature and drastically decreased coefficients of thermal expansion (CTE).

Example 6

9.6 g of the polyester prepared in Synthesis Example 1 and 0.4 g of the polybenzimidazole of Formula 3 were added to 40 g of NMP. The mixed solution was impregnated into a glass fiber having a size of 40×40×0.05 (mm). The resulting glass fiber was placed on an electrodeposited copper foil and dried in a furnace for 2 hours while raising the temperature of the furnace from room temperature to 300° C. The specimen was treated with 50 parts by weight of a nitric acid solution to completely remove the copper foil, leaving a prepreg only. At this time, 0.8 parts by weight of the polymers were impregnated into one part by weight of the glass fiber. A photograph of the prepreg is shown in FIG. 1.

Comparative Example 2

A prepreg was produced in the same manner as in Example 6 except that 10 g of the liquid crystal polyester prepared in Synthesis Example 1 only was added to 40 g of NMP. A plan view photograph of the prepreg is shown in FIG. 2.

Figure 2:
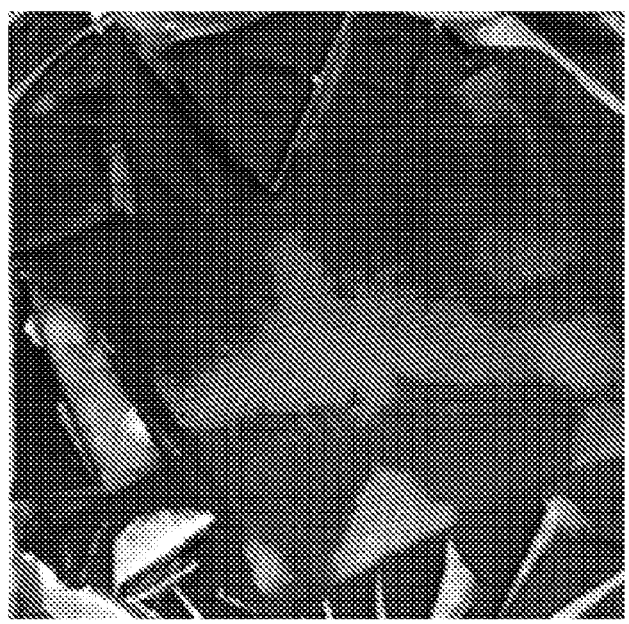

The photographs of FIGS. 1 and 2 reveal that the addition of the polybenzimidazole contributed to an improvement in the flexibility of the prepreg.

Example 7

Figure 3:
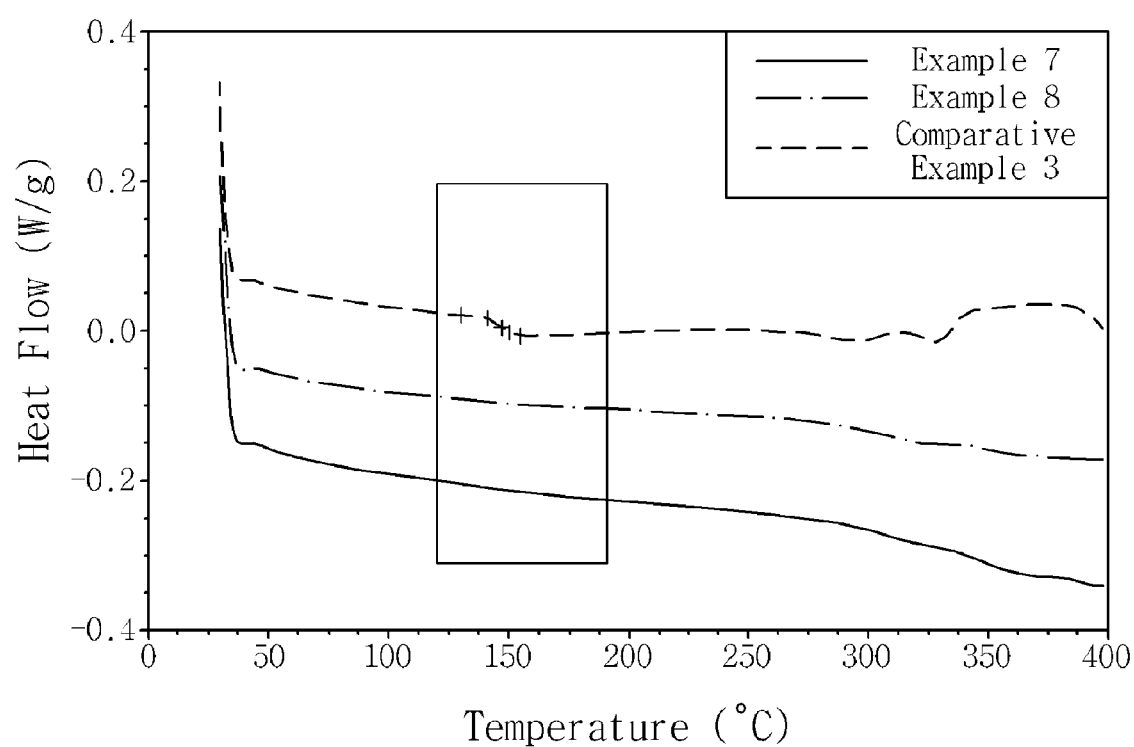

9 g of the liquid crystal polyester prepared in Synthesis Example 1 and 1 g of the polybenzimidazole of Formula 3 were added to 40 g of NMP to prepare a mixture. The mixture was laid on a petri dish, heated to 300° C., and dried for 2 hours to produce a liquid crystal polyester film. The heat flow of the film was measured using a differential scanning calorimeter (DSC). The results are shown in FIG. 3.

Example 8

A liquid crystal polyester film was produced in the same manner as in Example 7 except that 7 g of the liquid crystal polyester prepared in Synthesis Example 1 and 3 g of the polybenzimidazole of Formula 3 were added and mixed. The heat flow of the film was measured using a differential scanning calorimeter (DSC). The results are shown in FIG. 3.

Comparative Example 3

A liquid crystal polyester film was produced in the same manner as in Example 7 except that 10 g of the liquid crystal polyester prepared in Synthesis Example 1 only was added to 40 g of NMP. The heat flow of the film was measured using a differential scanning calorimeter (DSC). The results are shown in FIG. 3.

In a typical differential scanning calorimetry (DSC) thermogram, glass transition temperature ($T_g$) is defined as the point at which the calorie curve is inclined toward the endothermic region and is maintained constant. Referring to FIG. 3, the glass transition temperatures ($T_g$) of the polyester films of Examples 7 and 8 disappeared, unlike the polyester film of Comparative Example 3.

Although example embodiments have been described herein with reference to the foregoing preferred embodiments, those skilled in the art will appreciate that various modifications and changes are possible without departing from the spirit of example embodiments as disclosed in the accompanying claims. It is to be understood that such modifications and changes are within the scope of example embodiments.

What is claimed is:

1. A liquid crystal polyester resin composition comprising a liquid crystal polyester, a polybenzimidazole and an aprotic solvent.

2. The composition according to claim 1, wherein the liquid crystal polyester is a polyamide ester.

3. The composition according to claim 1, wherein the liquid crystal polyester contains at least one structural unit selected from the group consisting of the following structural units 1:

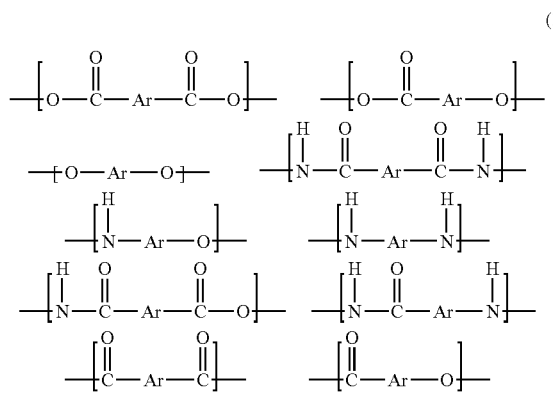

(1)

wherein each Ar is selected from the group consisting of the following groups 2:

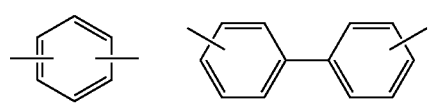

(2)

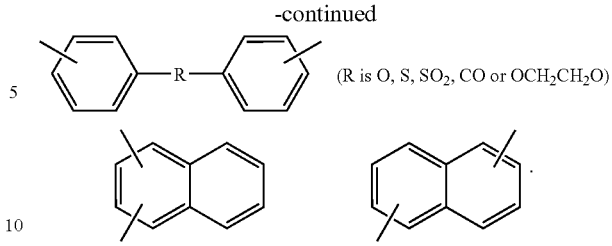

(R is O, S, SO$_2$, CO or OCH$_2$CH$_2$O)

4. The composition according to claim 1, wherein the polybenzimidazole is selected from the group consisting of poly-2,2'-(m-phenylene)-5,5'-dibenzimidazole, poly-2,2-(diphenylene-2",2"')-5,5'-dibenzimidazole, poly-2,2'-(diphenylene-4",4"')-5,5"-dibenzimidazole, poly-2,2'-(1",1",3"-trimethylindanylene)-3",5"-p-phenylene-5',5'-dibenzimidazole, 2,2'-(m-phenylene)-5,5'-dibenzimidazole/2,2'-(1",1",3"-trimethylindanylene)-3",5"-p-phenylene-5,5'-dibenzimidazole copolymer, 2,2'-(m-phenylene)-5,5'-dibenzimidazole/2,2'-(diphenylene-2",2"')-5,5'-dibenzimidazole copolymer, poly-2,2'-(furylene-2",5")-5,5'-dibenzimidazole, poly-2,2'-(naphthalene-1",6")-5,5'-dibenzimidazole, poly-2,2'-(naphthalene-2",6")-5,5'-dibenzimidazole, poly-2,2'-amylene-5,5'-dibenzimidazole, poly-2,2'-octamethylene-5,5'-dibenzimidazole, poly-2,2'-cyclohexenyl-5,5'-dibenzimidazole, poly-2,2'-(m-phenylene)-5,5'-di(benzimidazole)ether, poly-2,2'-(m-phenylene)-5,5'-di(benzimidazole)sulfide, poly-2,2'-(m-phenylene)-5,5'-di(benzimidazole)sulfone, poly-2,2'-(m-phenylene)-5,5'-di(benzimidazole)methane, poly-2,2'-(m-phenylene)-5,5'-di(benzimidazole)propane-2,2 and polyethylene-1,2,2,2"-(m-phenylene)-5,5'-di(benzimidazole) ethylene-1,2.

5. The composition according to claim 1, wherein the polybenzimidazole is represented by Formula 3:

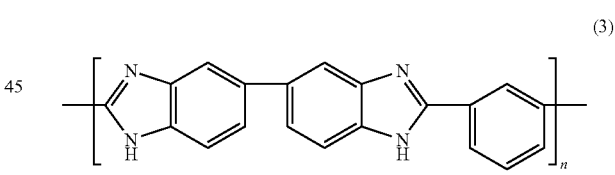

(3)

wherein n is from about 16 to about 1,600.

6. The composition according to claim 1, wherein the polybenzimidazole has a number average molecular weight of about 5,000 to about 500,000 grams per mole.

7. The composition according to claim 1, wherein the composition comprises 0.1 to 300 parts by weight of the liquid crystal polyester, 0.01 to 30 parts by weight of the polybenzimidazole and 100 parts by weight of the aprotic solvent.

8. A substrate made from the composition of claim 1.

9. The substrate according to claim 8, wherein the substrate is a printed board, a copper foil, a copper clad laminate or a prepreg.

10. The substrate according to claim 9, wherein the substrate is a copper clad laminate or a flexible copper clad laminate.

11. A method comprising:
mixing a liquid crystal polyester, a polybenzimidazole and an aprotic solvent; and
extracting the aprotic solvent to form a liquid crystal polyester resin composition.

12. The method of claim 11, further comprising disposing the liquid crystal polyester resin composition on a substrate.

13. The method of claim 12, wherein the disposing comprises roll coating, dip coating, spray coating, spin coating, curtain coating, slot coating, electrostatic painting or screen printing.

* * * * *